US 6,667,923 B1

(12) United States Patent
DelMain et al.

(10) Patent No.: US 6,667,923 B1
(45) Date of Patent: Dec. 23, 2003

(54) RAM DATA ARRAY CONFIGURED TO PROVIDE DATA-INDEPENDENT, WRITE CYCLE COHERENT CURRENT DRAIN

(75) Inventors: Gregory Jay DelMain, Maple Grove, MN (US); John Gord, Venice, CA (US); Lawrence J. Karr, Santa Monica, CA (US); Paul De Rocco, Pacific Palisades, CA (US); Glenn A. DeMichele, Lincolnshire, IL (US); Douglas Kerns, Sierra Madre, CA (US); Andrew Barber, Los Angeles, CA (US)

(73) Assignee: Alfred E. Mann Foundation for Scientific Research, Valencia, CA (US)

( * ) Notice: Subject to any disclaimer, the term of this patent is extended or adjusted under 35 U.S.C. 154(b) by 0 days.

(21) Appl. No.: 10/205,862

(22) Filed: Jul. 26, 2002

(51) Int. Cl.[7] .................................................. G11C 7/02
(52) U.S. Cl. ...................................... 365/206; 365/154
(58) Field of Search ................................. 365/154, 155, 365/156, 206

(56) References Cited

U.S. PATENT DOCUMENTS 5,991,192 A * 11/1999 Wang et al. ................. 365/154
6,075,721 A * 6/2000 Runaldue et al. ............ 365/154
6,091,664 A * 7/2000 Ramanadin .................. 365/154
6,307,772 B1 * 10/2001 Nagaoka ..................... 365/154

* cited by examiner

Primary Examiner—Tan T. Nguyen
(74) Attorney, Agent, or Firm—Lee J. Mandell

(57) ABSTRACT

An apparatus and method for forming a RAM data memory that generates predictable noise/interference components that are coherent with each write cycle and essentially independent of the data content of the RAM data memory. The RAM data memory is comprised of a plurality of cells, each representing a data bit, which are selectively addressable as memory bytes formed of multiple bits. Each cell is formed of two sets of cross-coupled transistors. By causing each set of cross-coupled transistors to be set to a common voltage level at the beginning of a write cycle before setting one set of transistors to a low level and the one set of transistors to be set to a high level (thus representing a desired data bit value), the associated noise/interference components of the power drain are data independent. Furthermore, the data-independent noise occurs at frequencies at or above the write cycle rate.

50 Claims, 16 Drawing Sheets

RAM DATA ARRAY CONFIGURED TO PROVIDE DATA-INDEPENDENT, WRITE CYCLE COHERENT CURRENT DRAIN

FIELD OF THE INVENTION

The present invention is generally directed to RAM (random access memory) arrays for use in an environment where noise or interference related components of its power usage can degrade the functioning of a system containing such RAM.

BACKGROUND OF THE INVENTION

A typical RAM (random access memory) array and in particular a static RAM array, is made up of a plurality of memory cells, each of which is comprised of a plurality, typically four (4) or more transistors to form the memory cell plus two (2) transistors for addressing the cell (a typical total of six (6) transistors). Preferably the transistors are FETs. As data is written into each cell, data-dependent current surges occur and undesirable noise results. In an environment where low noise is required, e.g., in a communication system, such data-dependent noise may degrade the potential capability of the system, e.g., its ability to discern a data signal and thus decrease the effective signal-to-noise ratio. Typically, communication systems exhibit a considerable variation in the content of their data signals and thus this data dependency may limit their capability to receive data signals without increasing the transmitted signal level, which may not be feasible or desirable. Accordingly, it would be desirable to limit the noise dependency and thus extend the capability of such a system, e.g., a communication system, that uses such a RAM.

SUMMARY OF THE INVENTION

The present invention is directed to RAM (random access memory) arrays for use in an environment where noise or interference related components of its power usage can degrade the functioning of a system containing such RAM. In an exemplary system, e.g., a communication system such as described in copending, common-assigned, U.S. patent application No. 09/882,603 which is incorporated herein by reference, the RAM may be used as an intermediate storage device for digitally sampled data from a communication channel. The sampled data is then digitally processed to extract a data stream. In this exemplary system, size and power restrictions limit the ability to otherwise increase the signal-to-noise ratio by increasing the signal, i.e., the transmitter power or size. Accordingly, in systems of the present invention the effective signal-to-noise ratio is instead improved by ensuring that any noise or interference components related to writing data into the RAM are positioned outside of the bandwidth of the communicated data.

To accomplish this task, one first notes that the typical architecture for a RAM cell, specifically a static RAM cell, includes forming two pairs of cross-linked transistors, typically FETs, where a first pair represents a data "1" value and the second pair represents a data "0" value. In the known prior art, a data transition from "1" to a "1" or from a "0" to a "0" may result in minimal changes in supply current and thus minimal power-related noise. However, a data transition from a "1" to a "0" or from a "0" to a "1" will result in a power-related noise surge. Whether a power-related noise surge occurs in the prior art is thus related to the sequence of data being written into the RAM, i.e., there is an undesirable amount of data dependency.

However, in embodiments of the present invention, the data dependency is removed by causing a first non data-dependent downward power surge when data is removed from a memory cell, and a second non data-dependent upward power surge occurs when the new data is written into the memory cell. Essentially, the same overall (downward then upward) power surges occur for a "1" to "1", "1" to "0", "0" to "0", or "0" to "1" transition, i.e., any data dependency is removed. Furthermore, the combination of the first and second transitions help cause the frequency component of the power surges to occur at elevated frequencies that can be more easily filtered out. In the particular exemplary embodiment of a communication system, the frequency components of the noise can be placed well above the frequency of the relevant portions of the communication signal.

While only groups of individual RAM cells (bits) corresponding to a selected data byte are affected during each write operation (typically a different group for each sequential write operation), a common differential data bus is preferably used to provide data to (or from) a selected group of RAM cells. Accordingly, while a selected group of RAM cells may only be a potential noise sources after many, e.g., 256 for an exemplary 256×N bit RAM, other write operations, the common data bus is a potential noise source for each write operation. Accordingly, the common data bus is operated in a manner similar to that previously described for the individual RAM cells, i.e., for each write operation, each side of the differential data bus is brought to a common voltage and then the respective sides of the data bus are brought to values representative of the desired data value.

A preferred RAM data memory configured for generating predictable noise or interference related components coherent with each write cycle, essentially independent of the data content of the RAM data memory, comprises: (1) a plurality of memory cells, each of which being comprised of two sets of cross-coupled transistors wherein each of the cells is capable of holding a data bit having a "1" or a "0" value; (2) a plurality of memory bytes wherein each of the bytes is comprised of a plurality of concurrently addressable memory cells; (3) an address circuit for selectively addressing one of the memory bytes and selecting the memory byte to be read or written and thus form a portion of a read or a write cycle, respectively; and (4) write sequencing logic for removing charge from the selectively addressed cross-coupled transistors comprising the selectively addressed memory cells of the selectively addressed memory byte having an initial byte value before adding charge to the selectively addressed cross-coupled transistors of the selectively addressed memory cells of the selectively addressed byte to cause the memory byte to correspond to a desired byte value; and whereby current transitions associated with the removing and the adding of charge from the memory cells of the memory bytes are essentially independent of any relationship between the initial byte value and the desired byte value.

A preferred method for controlling write cycles in a RAM memory such that predictable noise or interference related components are generated coherent with each write cycle, essentially independent of the data content of the RAM data memory, wherein the RAM memory is comprised of a plurality of memory cells, each of which being suitable for containing a "1" or a "0" data bit value, a plurality of the memory cells are essentially concurrently addressable to represent a memory byte, comprises the steps of: (1) selecting a plurality of the memory cells corresponding to a selected memory byte; (2) removing power from each of the selected memory cells, wherein the power reduction is essentially independent of the data content of each of the selected memory cells; and (3) enabling a portion of each of the selected memory cells such that the enabled portion then represents a desired data bit value and the combination of the selected memory cells then represents a desired data byte value, wherein the step of enabling a portion of each of the selected memory cells comprises providing power to selected portions of the selected memory cells and resulting in a power increase essentially independent of the desired data byte value; and wherein the magnitude of the power reduction and the power increase are essentially the same.

In a further aspect of the present invention, the RAM comprises at least two address circuits, each of which are capable of individually enabling a data byte to be written to portions of the RAM. In a still further aspect, at least one of the address circuits automatically increments with each write cycle such that it automatically selects a different portion of RAM for each sequential write cycle. In a significant feature of this automatically incrementing mode of operation, the address circuit is comprised of a row address circuit and a column address circuit, each of which contains multiple address bits and only one of each multiple address bits is altered at any one time.

The novel features of the invention are set forth with particularity in the appended claims. The invention will be best understood from the following description when read in conjunction with the accompanying drawings.

BRIEF DESCRIPTION OF THE DRAWINGS

FIG. 10 is a partial truth table for the address logic of FIGS. 9A–9F.

DETAILED DESCRIPTION OF THE PREFERRED EMBODIMENTS

Figure 1:
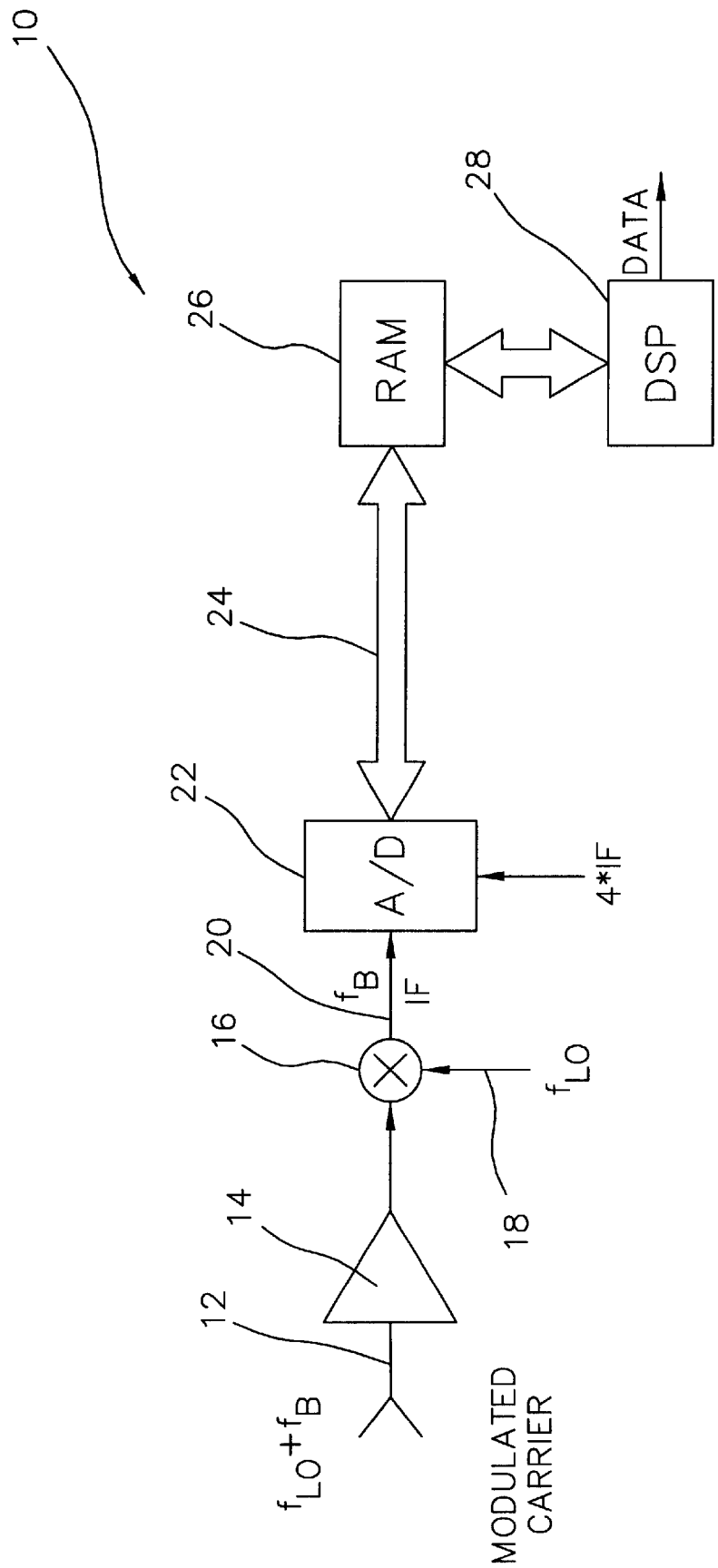
FIG. 1 shows an exemplary communication system suitable for using the RAM of the present invention.

The following description is of the best mode presently contemplated for carrying out the invention. This description is not to be taken in a limiting sense, but is made merely for the purpose of describing the general principles of the invention. The scope of the invention should be determined with reference to the claims.

The present invention is directed to RAM (random access memory) arrays for use in an environment where noise or interference related components of its power usage can degrade the functioning of a system containing such RAM. In an exemplary system, e.g., a communication system such as described in copending, common-assigned, U.S. patent application No. 09/882,603 which is incorporated herein by reference, the RAM may be used as an intermediate storage device for digitally sampled data from a communication channel during a first time period. The sampled data is then retrieved from RAM and digitally processed during a second time period, temporally offset from the first time period, to extract digital data contained within. In this exemplary system, size and power restrictions limit the ability to otherwise increase the signal-to-noise ratio by increasing the signal, i.e., the transmitter power or size. For example, in the '603 application, the communication system is encased in an essentially cylindrical housing having an axial dimension of less than 60 mm and a lateral dimension of less than 6 mm and configured for implantation into a patient's body, e.g., via injection. This exemplary implantable microdevice is preferably battery powered (preferably rechargeable) but due to its small size, its battery capacity is limited. Accordingly, in systems of the present invention the effective signal-to-noise ratio is instead improved by ensuring that any noise or interference components related to writing data into the RAM are positioned outside of the bandwidth of the communicated data.

To accomplish this task, one first notes that the typical architecture for a RAM cell, specifically a static RAM cell, includes forming two pairs of cross-linked transistors, typically FETs, where a first pair represents a data "1" value and the second pair represents a data "0" value. In the known prior art, a data transition from "1" to a "1" or from a "0" to a "0" may result in minimal changes in supply current and thus minimal power-related noise. However, a data transition from a "1" to a "0" or from a "0" to a "1" will result in a power-related noise surge. Whether a power-related noise surge occurs in the prior art is thus related to the sequence of data being written into the RAM, i.e., there is an undesirable amount of data dependency.

However, in embodiments of the present invention, the data dependency is removed by causing a first non data-dependent downward power surge when data is removed from a memory cell, and a second non data-dependent upward power surge occurs when the new data is written into the memory cell. Essentially, the same overall (downward then upward) power surges occur for a "1" to "1", "1" to "0", "0" to "0", or "0" to "1" transition, i.e., any data dependency is removed. Furthermore, the combination of the first and second transitions help cause the frequency components of the power surges to occur at elevated frequencies, i.e., at multiples of the data writing frequency, that can be more easily filtered out. In the particular exemplary embodiment of a communication system, the frequency components of the noise can be placed well above the frequency of the relevant portions of the communication signal. In addition, these noise components are at multiples of and coherent with the sampling rate and approach zero amplitude in their higher multiples. Accordingly, this coherent noise is easily filtered out.

Furthermore, while only groups of individual RAM cells (bits) corresponding to a selected data byte are affected during each write operation (typically a different group for each sequential write operation), a common differential data bus is preferably used to provide data to (or from) a selected group of RAM cells. Accordingly, while a selected group of RAM cells may only be a potential noise sources after many, e.g., 256, other write operations, the common data bus is a potential noise source for each write operation. Accordingly in embodiments of the present invention, the common data bus is preferably operated in a manner similar to that previously described for the individual RAM cells, i.e., for each write operation, each side of the differential data bus is brought to a common voltage and then the respective sides of the data bus are brought to values representative of the desired data value.

FIG. 1 shows an exemplary communication system 10 suitable for using the RAM of the present invention. In this system, a modulated carrier wave 12 (i.e., a carrier signal modulated by a data signal) is received and amplified by amplifier 14. The signal is then downconverted by multiplier 16 which is subjected to local oscillator frequency 18. The resulting IF signal 20 is the sum and the difference of the modulated carrier wave 12 and the local oscillator frequency 18. The sum signal is at a high enough frequency to be easily filtered out (or ignored). In this example, the carrier frequency is 400 MHz and the data signal is 6.3 MHz. Accordingly, the modulated data signal 12 is at 406.3 MHz. Once the modulated data signal from amplifier 14 has been multiplied by the local oscillator signal 18, the resulting IF signal is the data signal at 6.3 MHz (and 806.3 MHz). The IF signal 20 is then digitally sampled by an A/D converter 22 at a frequency of at least twice the IF bandwidth, i.e., the Nyquist sampling rate. Preferably, the signal is sampled at four (4) times the bandwidth of the IF signal, i.e., at 25.2 MHz in this example, to generate sampled digital data 24, preferably 6–8 bits of parallel data. By sampling at twice the Nyquist sampling rate, additional time-spaced data is obtained that can facilitate digital signal processing of the sampled data and the extraction of the modulated data contained within.

In this exemplary system 10, the digital data 24 is stored in the RAM 26 of the present invention for subsequent processing by a digital signal processor (DSP) 28. Preferably, RAM 26 is essentially used as a FIFO (first-in first-out) buffer for temporary storage of the received data. In this exemplary system, e.g., a communication system such as described in copending, common-assigned, U.S. patent application No. 09/882,603, the data need not be concurrently processed with its receipt since there is a significant time between receipt of the modulated data signal and the time when the system component, e.g., a microstimulator, needs to respond to the data contained within. Thus, by using RAM 26 as an intermediate data storage, the sampled data can be processed to extract the data content within by a relatively low speed DSP 28, i.e., at a processing speed significantly less than that required for real time processing. Additionally, by processing the data at a lower speed, power can be saved, a feature that is significant when used as part of an implantable microstimulator as described in the '603 application. Further power savings can be achieved by turning off power (or reducing the clock rate to accordingly reduce power consumption) to the DSP 28 during receipt of the modulated carrier wave 12 and turning off power to the amplifier 14, multiplier 16 and A/D converter 22 while the captured data is being processed, i.e., demodulated.

Figure 2:
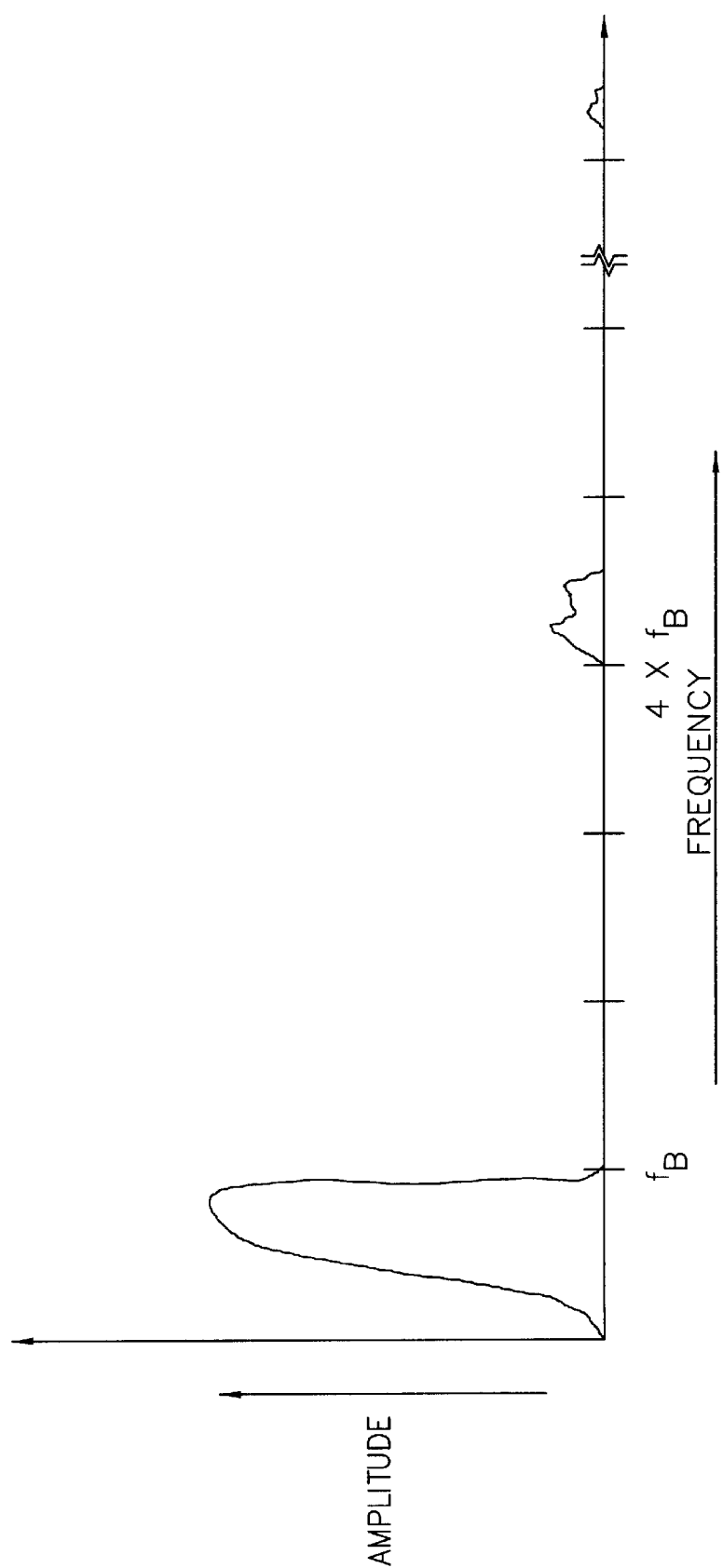
FIG. 2 is an exemplary spectral diagram showing how the RAM-related noise can be placed well outside of the spectral content of the data signal by using the RAM of the present invention.

When processing data, typically generated by such a low power device (and corresponding to a relatively low S/N ratio), it becomes significant to minimize as many noise sources as is possible. A conventional RAM is such a noise source. In contrast, the RAM 26 of the present invention is configured to minimize the amount of noise and specifically any in-band noise. Typically, the noise generated by RAM is dependent upon changes between the old data stored in RAM and the new data that is subsequently written into RAM. However, in the present invention, this data dependency is minimized by ensuring that data is altered during every write cycle, i.e., at the sampling rate which is preferably $4*f_B$ (where $f_B$ is the bandwidth of the demodulated IF data signal), even if the old and new data values are the same. Accordingly, as shown in FIG. 2, RAM-related noise occurs at frequencies well beyond the data frequency. Thus, any noise effects are inherently minimized and may be further minimized by digital filtering in the DSP 28.

Figure 3:
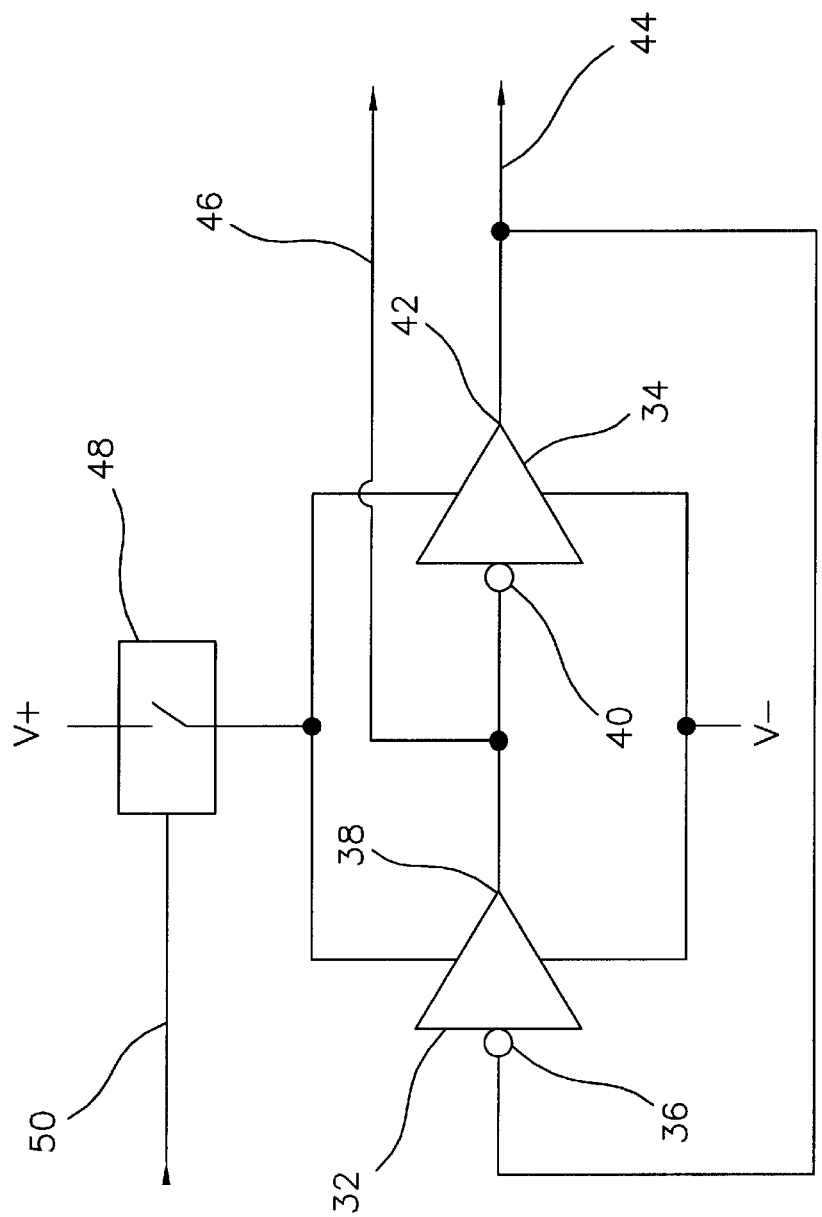
FIG. 3 shows a simplified logic diagram of a static memory cell comprised of a pair of inverters coupled such that they have two stable storage states.

RAM 26 is made up of a plurality of static memory cells, preferably arranged in a row-column array to simplify addressing. Each memory cell is capable of storing a single bit (binary digit), i.e., a "1" or a "0". In an exemplary case used for descriptive purposes, the array is 16×16 and is 6 bits deep, i.e., it stores 256 6-bit bytes. (In the currently preferred implementation, this RAM is formed as a 256×12 bit array.) A simplified example of the logic that forms each memory cell 30 is shown in FIG. 3 as a pair of inverters 32, 34 coupled such that the combination has two storage states. For example, when the input 36 to inverter 32 has a value of "1", its output 38 has a value of "0". Output 38 is coupled to input 40 of inverter 34 and its output 42 is coupled to input 36 of inverter 32. Accordingly in this case, input 40 has a value of "0" and output 42 has a value of "1". Thus, this configuration is stable with output (node) 44 having a value of "1" and output-(node) 46 having a value of "0". Likewise, this configuration will retain a stable state with all of the output values being reversed, e.g., all "0"s become "1"s and all "1"s become "0"s.

To switch output states, one could source or sink current at the outputs (nodes) 44, 46 or additional logic could be added to facilitate switching states. However, as previously discussed, when this is done with a conventional RAM, the potential current surges are data dependent. For example, in the known prior art, a data transition from "1" to a "1" or from a "0" to a "0" may result in minimal changes in supply current and thus minimal power-related noise while a data transition from a "1" to a "0" or from a "0" to a "1" will result in a power-related noise surge. Accordingly, whether a power-related noise surge occurs in the prior art is thus related to the sequence of data being written into the RAM and the spectrum of the power-related noise may thus overlap the spectrum of the data.

Figure 4:
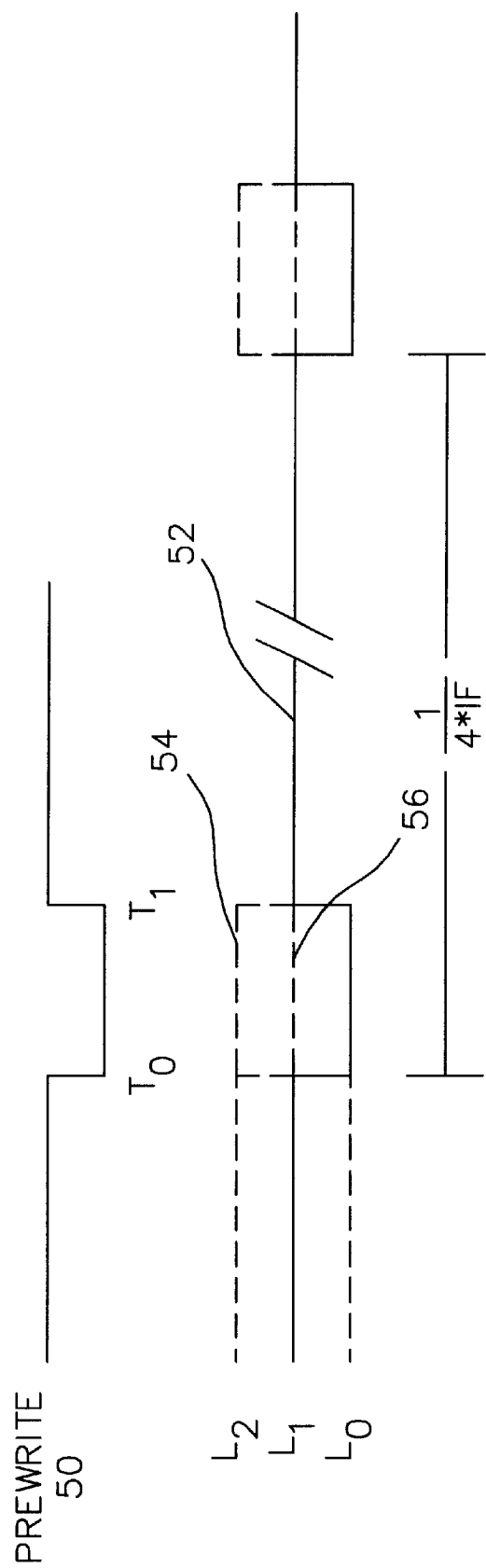
FIG. 4 is a timing diagram of the data-independent current consumed by a cell of the RAM of the present invention.

How this problem is solved in embodiments of the present invention is described in relation to FIGS. 3 and 4. As shown in FIG. 3, a power switch 48 is added to selectively remove power from cells subject to power control/prewrite control line 50. (Actually, the power switch may be comprised of a separate switch for each half cell, i.e., inverter 32, 34, or may be a single power switch for each group of cells that form a byte, e.g., a single switch for 6–8 cells.) Accordingly, power control signal 50 causes power switch 48 to remove power at time $T_0$ to commence the write cycle that concludes at $T_1$ (see the solid line 52 of FIG. 4 which represents the power usage of the cell 30). Shortly after $T_0$, outputs (nodes) 44, 46 are discharged. FIG. 4 shows the corresponding power/current reduction from $L_1$ to $L_0$. It is significant that independent of the initial state of the cell, power is removed from a single energized half cell and a single de-energized half cell and charge is then removed from the single energized half cell (essentially no charge is removed from the single de-energized half cell). Just prior to $T_1$, the nodes 44, 46 corresponding to the desired new state of the cell 30 are set and the power control line 50 is re-set to re-supply power to the cell 30. Again, charge is only supplied to a single half-cell and thus the power surge at $T_1$ corresponding to the change from $L_0$ to $L_1$ is essentially data independent. Thus, during each write cycle (time period $T_0$ to $T_1$), a downward power surge starts to occur (i.e., from $L_1$ to $L_0$) as the cell is shifted to a 0—0 state, followed by an essentially equal upward power surge (i.e., from $L_0$ to $L_1$) as the cell is shifted from the 0—0 state. Since write cycles occur at the sampling rate, this data independent noise will occur well above the spectrum of the data (see FIG. 2).

While FIG. 4 primarily shows nodes 44, 46 being discharged, alternative data-independent possibilities are also considered to be within the scope of the present invention. For example, instead of discharging nodes 44, 46 at $T_0$ time, these nodes could both be charged to a high "1" state as designated by dashed lines 54 and the increase of the power level to $L_2$. Accordingly in this implementation, one node would change from a "1" to a "1" and the other node would change from a "0" to a "1". As previously described, it is insignificant which node makes the transition, it is only significant that it is only a single node. Just prior to $T_1$ time, a single node will then be changed to a "0" state before power is re-enabled to the cell 30.

In a next alternative implementation, nodes $T_0$ and $T_1$ can be shorted to each other to bring equilibrium between the charged nodes to a "½" state as designated by dotted line 56. Just prior to $T_1$ time, one node is then raised to a "1" state and the other node is lowered to a "0" state. At each transition, there is a positive half state transition and a negative half state transition with the effective overall transition being zero in each case. What is most significant is that the intermediate voltage level be a common voltage level. Whether it is a low, high, a "½" state, or any other common voltage level, all will result in the data independent noise of the present invention.

Figure 5:
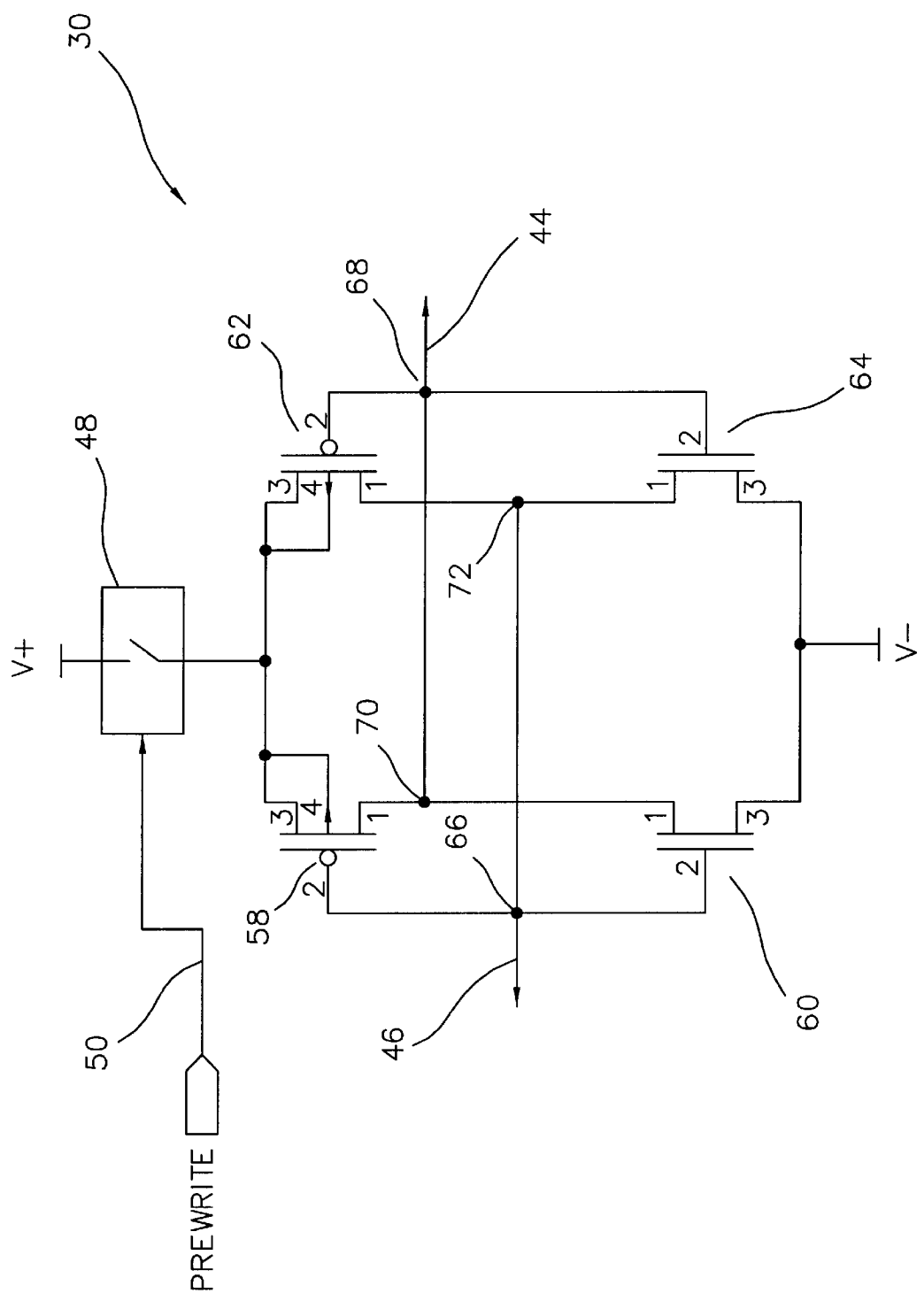
FIG. 5 is a simplified exemplary structure for forming a memory cell from four (4) FETs comprising two half memory cells of two (2) FETs each.

FIG. 5 shows a simplified exemplary transistor structure of memory cell 30 formed from four (4) FETs 58, 60, 62, 64 comprising two half memory cells of two (2) FETs each, i.e., FETs 58, 60 and FETs 62, 64. Each half memory cell (essentially comprising an inverter) is comprised of a p-channel FET (e.g., 58 and 62) and an n-channel FET (e.g., 60 and 64) with their gates coupled together at nodes 66, 68. For example, when node 66 is high, FET 58 is switched off and FET 60 is switched on. Accordingly, output 70 is held low. Conversely, if node 66 is low, output 70 will be pulled high. Each half memory cell is cross-linked to the other half memory cell, i.e., the output 70 of the first half memory cell 58, 60 is coupled to the input 68 of the second half memory cell 62, 64 and the output 72 of the second half memory cell 62, 64 is coupled to the input 66 of the first half memory cell 58, 60. Accordingly, the circuit of FIG. 5 performs as a memory cell having two stable memory states as was previously described in reference to FIG. 3.

Figure 6:
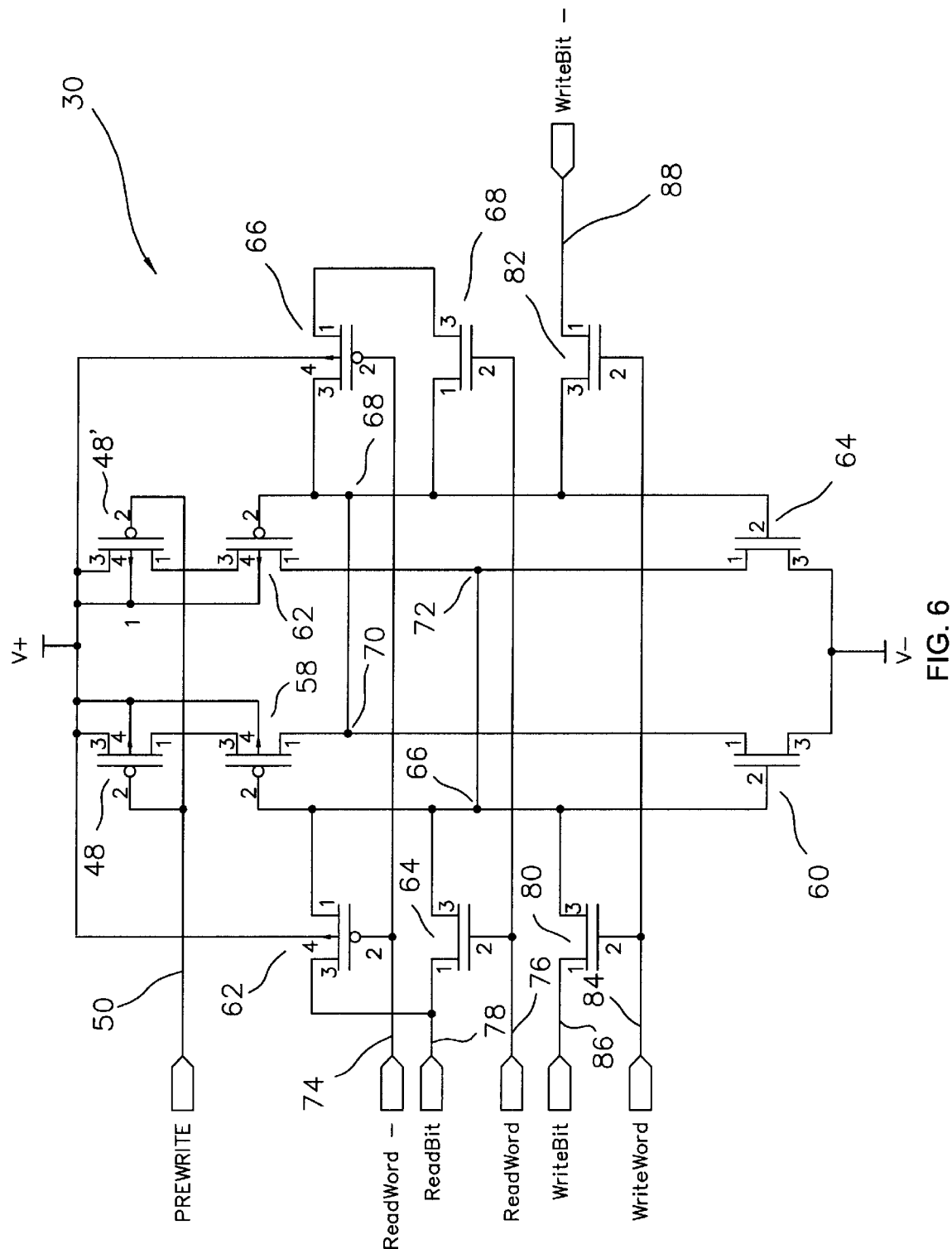
FIG. 6 shows a detailed exemplary transistor structure of a memory cell of the present invention that encompasses the features described in relation to FIGS. 3 and 5.

FIG. 6 shows a detailed exemplary transistor structure of a memory cell 30 of the present invention. Much of what is shown is identical to what has been described in relation to FIG. 5 and accordingly the same numbers are used to describe its common elements. The relevant additional details will now be described.

First, the power switch of FIG. 3 is shown which is comprised of p-channel FETs 48, 48' which individually provide power to each of the half memory cells under control of prewrite control line 50. As previously discussed, the use of individual switches for each of the half memory cells, a single switch for the entire memory cell, the use of a single switch for multiple memory cells to enable a byte, etc., are all variations of the power switching that may be used within embodiments of the present invention.

The ability to read a data bit from the memory cell 30 is shown in more detail, commensurate with a typical structure used to select individual cells for a particular memory address and direct its data value contents to a common data bus. To accomplish this task, p-channel FET 62 and n-channel FET 64 are added and respectively concurrently enabled (or disabled) in response to readword- 74 and readword 76 control lines to provide or block data from flowing to readbit output 78 from the first half memory cell comprised of FETs 58, 60. Additionally, FETs 66, 68 are coupled to the second half memory cell to accordingly subject the FETs 62, 64 of the second half memory cell to an essentially identical capacitive load during a read and especially during a write operation.

Figure 7:
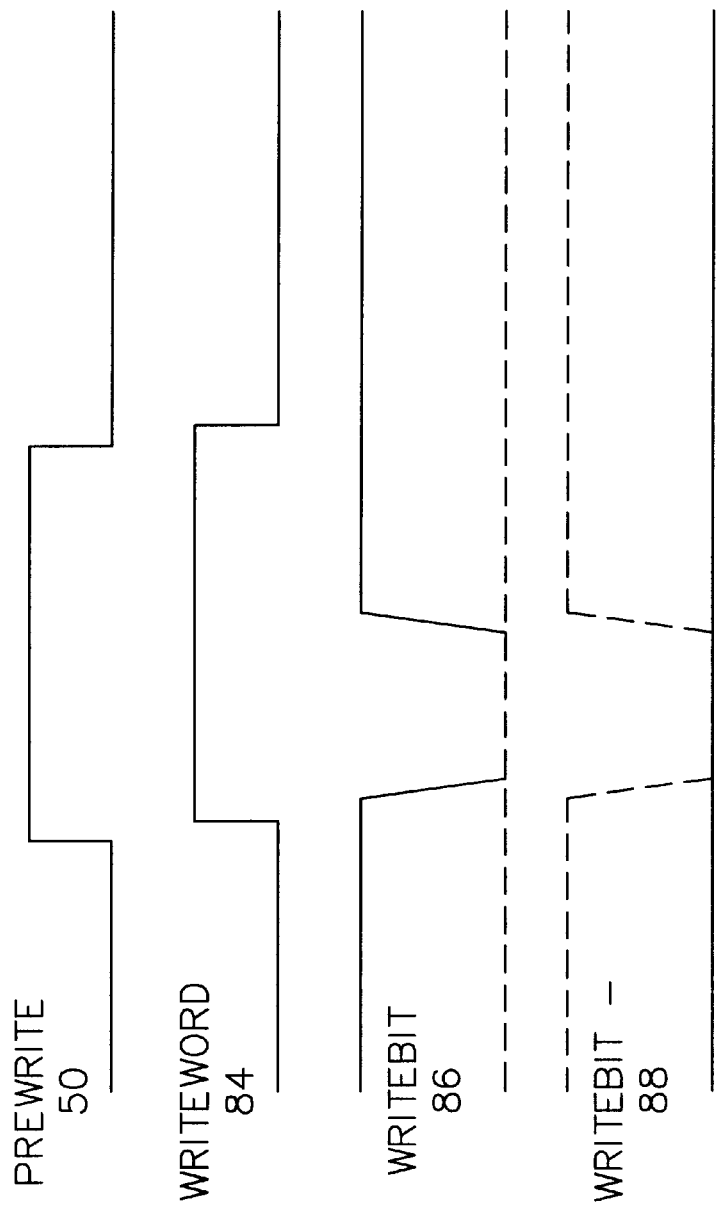
FIG. 7 shows an exemplary timing diagram for utilizing the features of the memory cell of FIG. 6.

The capability to write into memory cell 30 is provided through FET 80 (to the first half memory cell) and FET 82 (to the second half memory cell) under control of writeword control line 84. Individual data signals writebit 86 and writebit- 88 are switched via FETs 80, 82 into nodes 66, 68, respectively of the first and second half memory cells. In operation, a write cycle commences by raising the prewrite control line 50 to remove power from the cell. Next the writeword control line 84 is raised and the writebit 86 and the writebit- 88 data signals are both lowered. This serves to remove the charge from both sides of the memory cell 30 (actually charge is only removed from the half cell that is currently active, i.e., high). Next, either the writebit 86 or the writebit- 88 data signal is raised, depending upon the new data value. Finally, the prewrite control line 50 is returned low to enable power to the memory cell and after power has returned, the writeword control line 84 is lowered and the data is latched into the memory cell 30. This data-independent power cycling is shown in timing diagram FIG. 7. It is additionally recognized that this configuration can be modified to enable each half memory cell to be raised or shorted to each other during the first portion of the write cycle to cause each half memory cell to have a common value, as previously described.

Figure 11:
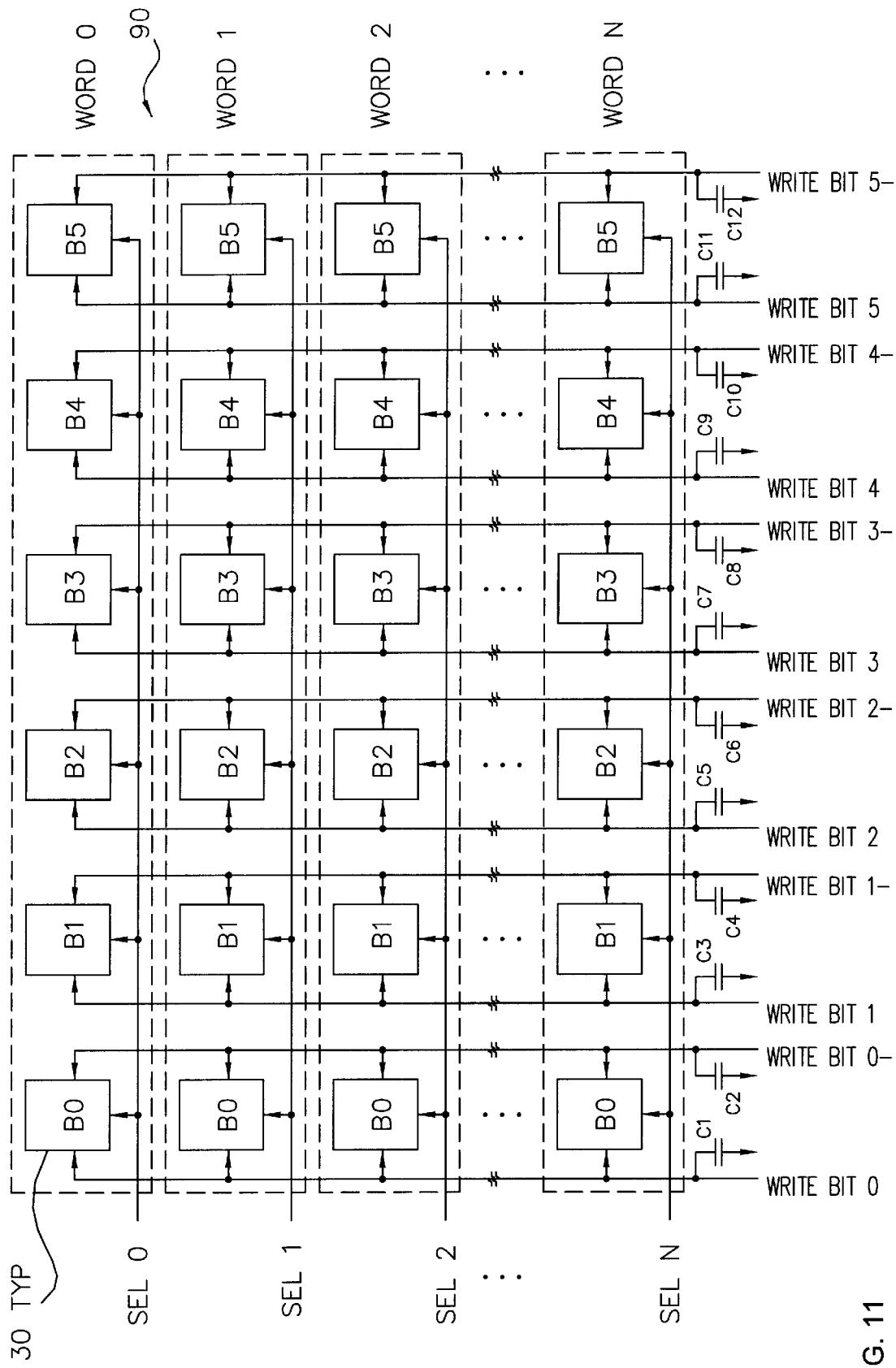
FIG. 11 is a simplified block diagram of the RAM of the present invention showing a plurality of pairs of differential bus lines for driving selected memory cells in a manner similar to that of the individual memory cells and thus generating data independent and spectrally displaced noise.

While only groups of individual RAM cells (bits) corresponding to a selected data byte are affected during each write operation (typically a different group for each sequential write operation), a common differential data bus formed of a plurality of pairs of writebit, writebit- data lines (see FIG. 11) is preferably used to provide data to (or from) a selected group of RAM cells. The differential data bus is subject to stray wiring capacitance (C1–C12 in this example) due to the distribution of the memory cells. Accordingly, while a selected group of RAM cells may only be a potential noise source after many, e.g., 256 for an exemplary 256×N bit RAM, other write operations, the common data bus is a potential noise source for each write operation. Accordingly in embodiments of the present invention, the common data bus is preferably operated in a manner similar to that previously described for the individual RAM cells, i.e., for each write operation, each side of the differential data bus is brought to a common voltage and then the respective sides of the data bus are brought to values representative of the desired data value. Thus, in addition to making the noise essentially independent of the previous contents of the currently used memory cell, discharging both sides of the write bus (writebit and writebit- at the start of a write cycle, the noise generated in the drivers for these lines is essentially independent of what was written to the preceding memory cell on the previous write cycle as well.

Figure 8:
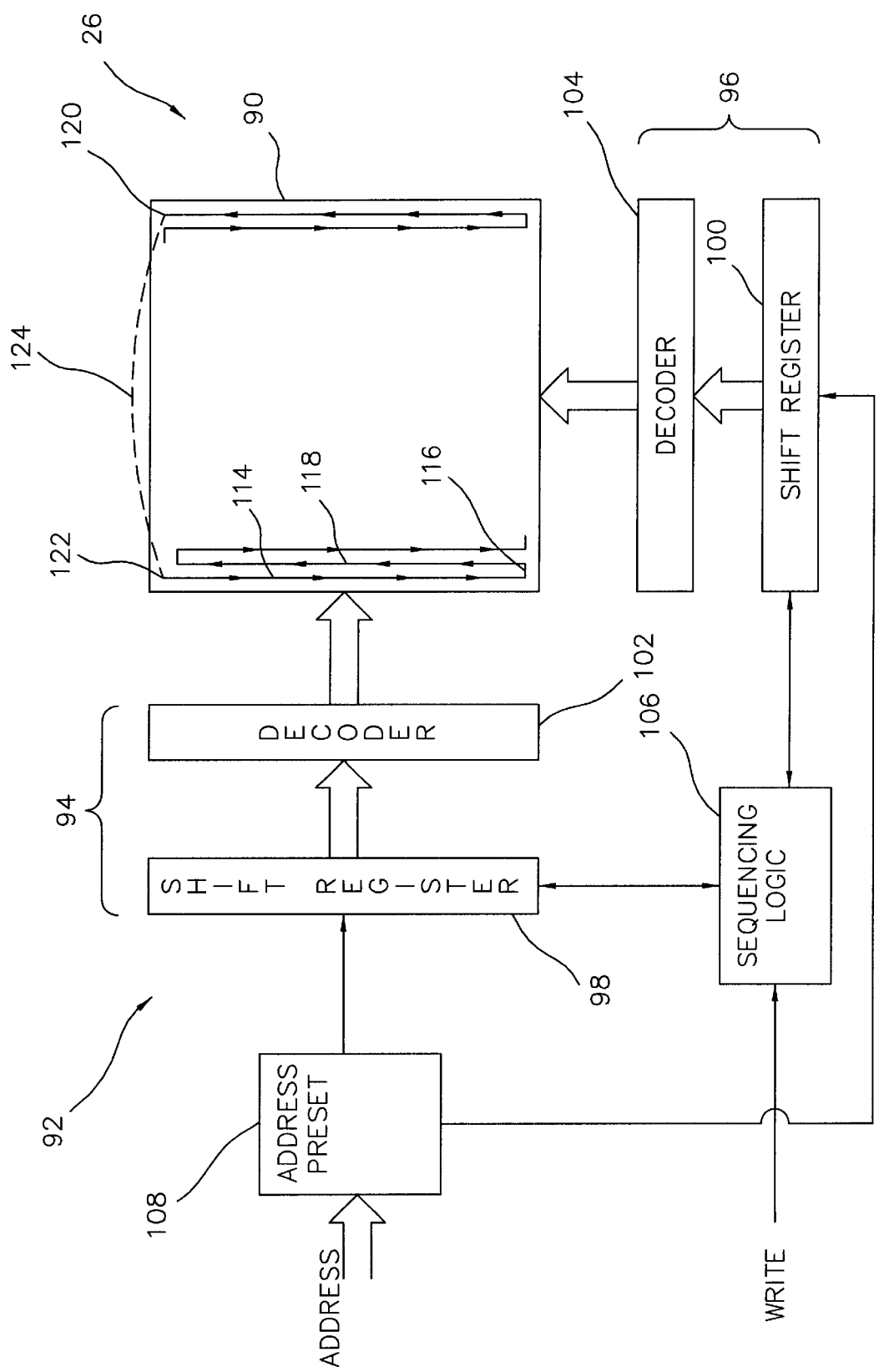
FIG. 8 shows an exemplary embodiment of the RAM of the present invention including the memory cell array which stores the data bits and address logic for accessing groups of memory cells from within the array.

A plurality of cells are arranged in an array structure 90, i.e., an A×B structure, that is addressable by selecting an A and a B value. Typically, these A and B values are referred to as rows and columns and are typically of the same size, i.e., the maximum number of rows equals the maximum number of columns. In the exemplary embodiment described in relation to FIGS. 8–10, there are 16 rows and 16 columns and thus there are $16^2=256$ possible memory addresses, each of which contains a 6-bit byte, i.e., 6 cells are associated with each memory address. (It is recognized that the terms rows and columns are interchangeable in this description and are only used to simplify the graphical description of how the address logic operates.) Memory addresses are selected by address logic 92, preferably comprised of row address logic 94 and column address logic 96.

The address logic 92 enables selection of single memory address to read or write a byte of data. Furthermore, to facilitate use of the RAM 26 of the present invention as a FIFO buffer, the address logic 92 auto-increments with each write pulse, i.e., following each write (or read) operation, the address logic 92 points to the next memory address (when the last memory address, e.g., memory address 255, is incremented, the next memory address is address 0). Additionally, it is preferred that the address logic be initializable to begin with a specified address and that there be at least two sets of address logic such that one set of address logic is used as a head pointer to address the next memory address to be written and a next set of address logic is used as a tail pointer to address the next memory address to be read. In operation, the head and tail pointers are initially set to the same value, e.g., 0, and the head pointer is used to direct storage of sampled data. As data is processed by DSP 28 (preferably not concurrent with the storage of sampled data), the tail pointer is used to remove/read the stored data. Additional similar sets (not shown) of address logic 92 may be used to store and retrieve data from other sources or for other needs, e.g., for storing data from a "low speed" A/D that samples environmental data, e.g., sampled body parameters.

In the previously described exemplary environment, i.e., in a communication system, it is essential to minimize noise or interference related components of the logic wherever possible. Accordingly, the address logic 92 of the present invention is preferably formed along with the memory array 90 on the same integrated circuit chip. Additionally, the use of a binary counter for the auto-incrementing address logic is avoided in the present invention. Instead, "shift registers" are used to perform this function, e.g., a Johnson counter.

The use of the term "shift register" in this application is used to distinguish such a device from the term "counter" which references an incremental, typically binary weighted, device. A shift register is conventionally recognized as a plurality of bit storage devices, e.g., flip flops, that are arranged in a structure such that they feed successive bit storage devices in response to each clock pulse. Such a device constructed according to the conventional definition may be used to perform the needed function. However, in an exemplary implementation of the shift register of the present invention, a plurality of flip flops are used along with sequencing logic to perform essentially the same function such that it appears to be a conventional shift register if its outputs were examined, i.e., if viewed as a black box. Accordingly, the term shift register as used herein includes such a flip flop with sequencing logic construct as well.

In the present invention, the address logic 92 is primarily comprised of a pair of shift registers, a row shift register 98 and a column shift register 100, that are constructed such that only a single shift register bit changes each time the address logic 92 is sequenced, e.g., incremented. (While it is noted that only a single shift register changes with each "increment" in this implementation, what is most notable of preferred embodiments of the address logic of the present invention is that an equal number of bits change with each "increment".) It is recognized that if a counter were used, multiple bits could change with each address increment and the number of bit changes, and thus the generated noise, would be different, depending upon the current actual address. Accordingly, the present invention minimizes the noise and ensures that the amount of noise generated is essentially independent of the actual memory address. Thus, the RAM 26 of the present invention is well suited for use in a communication system or similar environments.

Figure 9A:
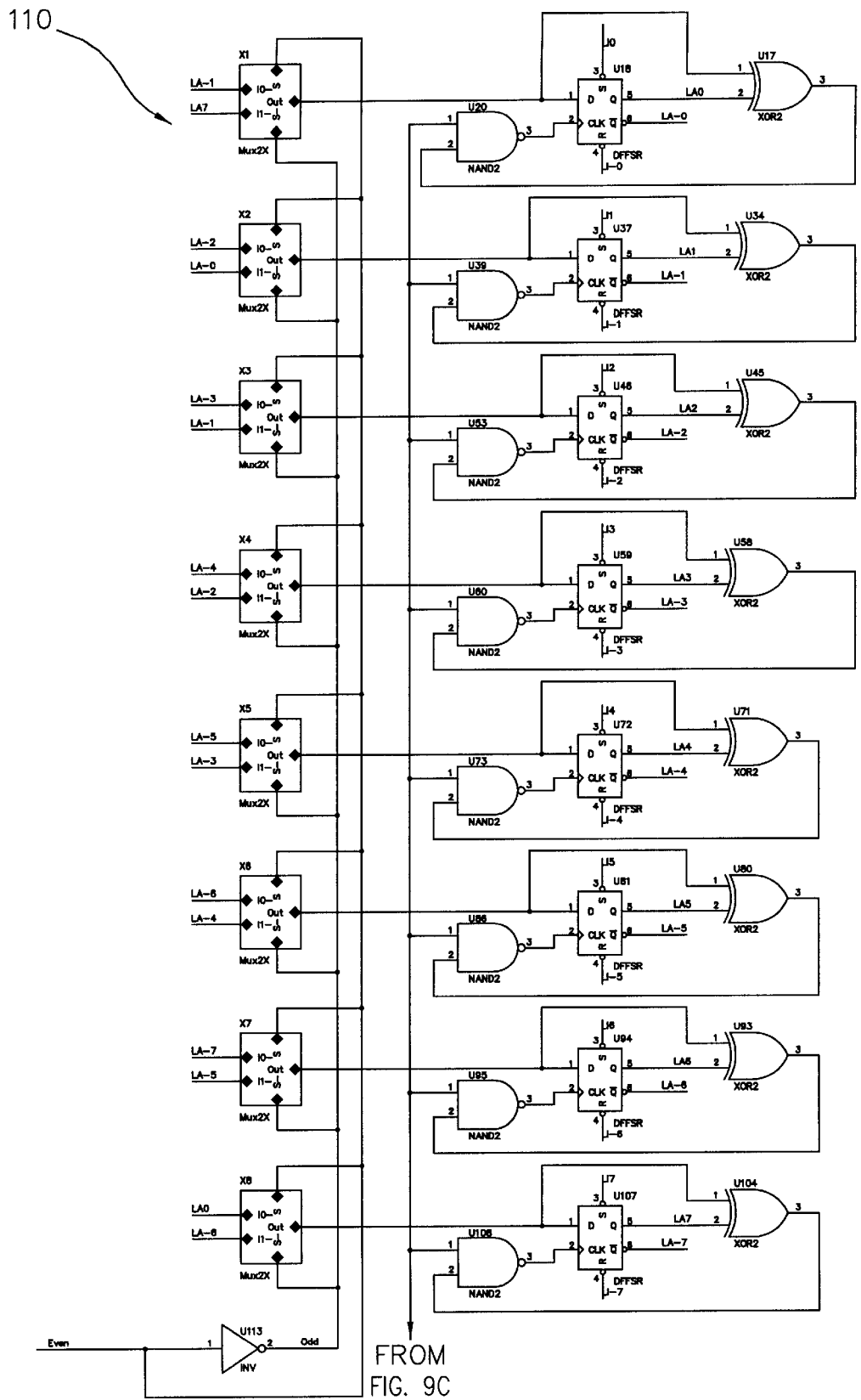
FIGS. 9A–9F show an exemplary implementation of the address logic of the RAM of FIG. 8 which has been configured to minimize the noise generated associated with addressing "sequential" memory locations.
Figure 9B:
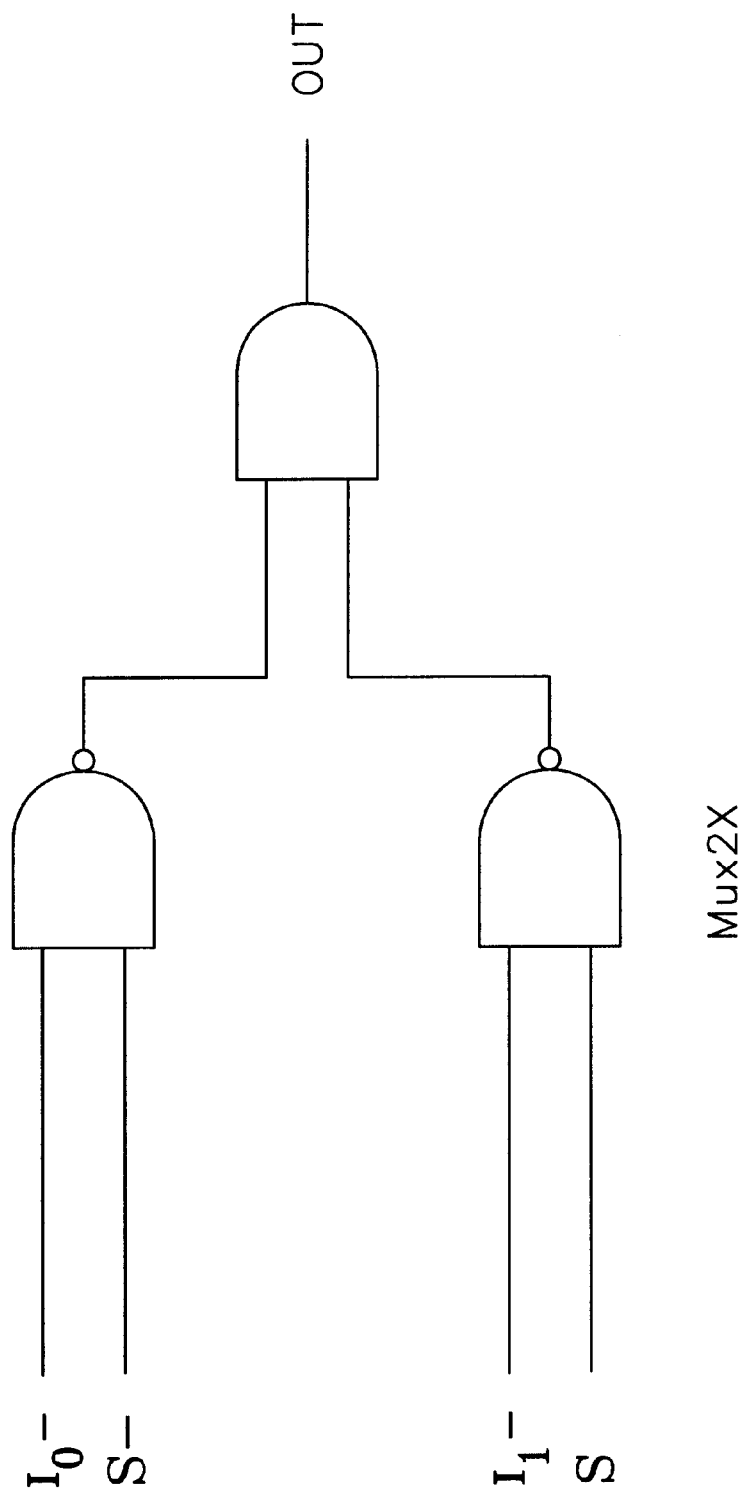
Figure 9C:
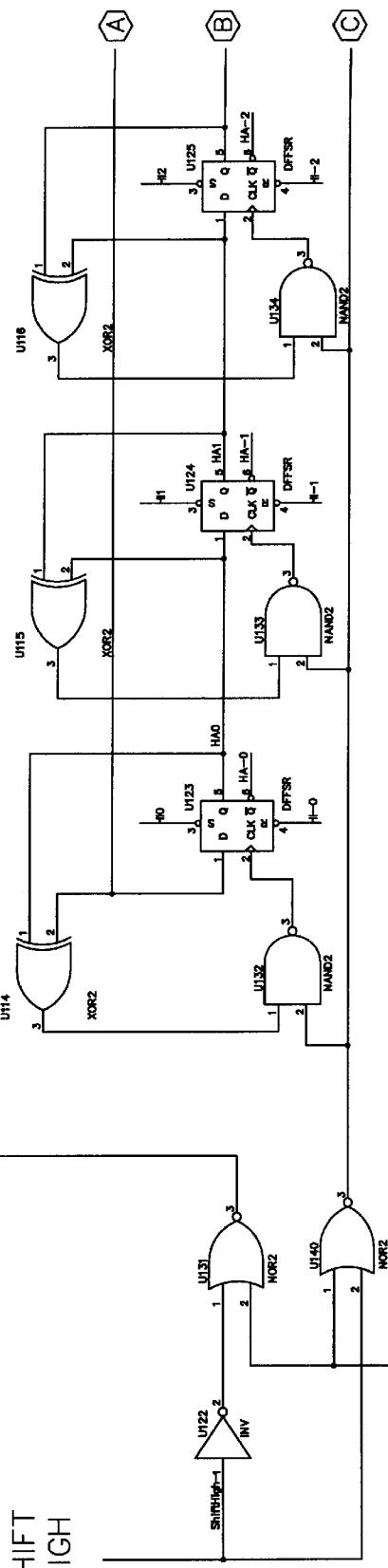
Figure 9C:
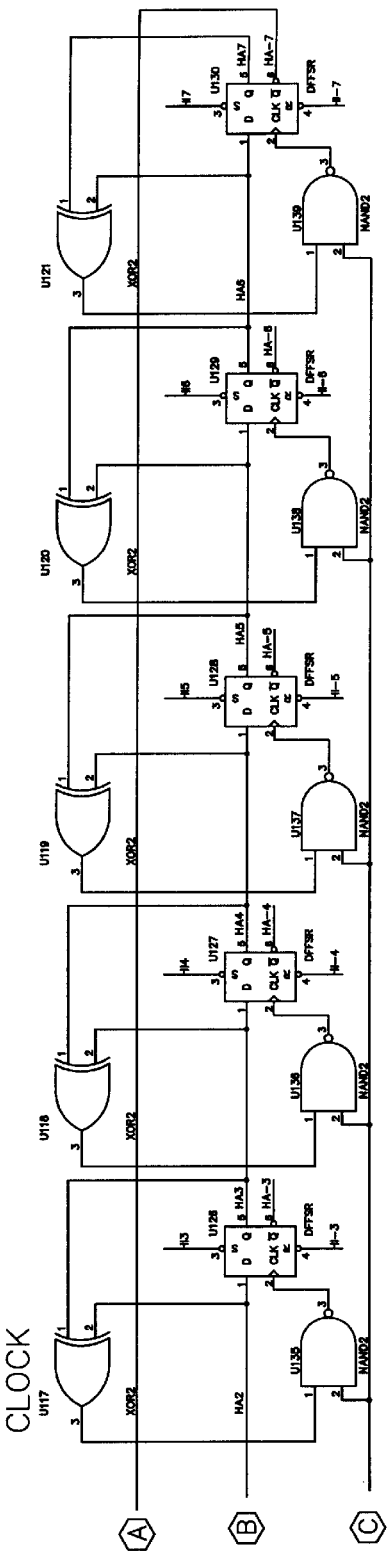
Figure 9D:
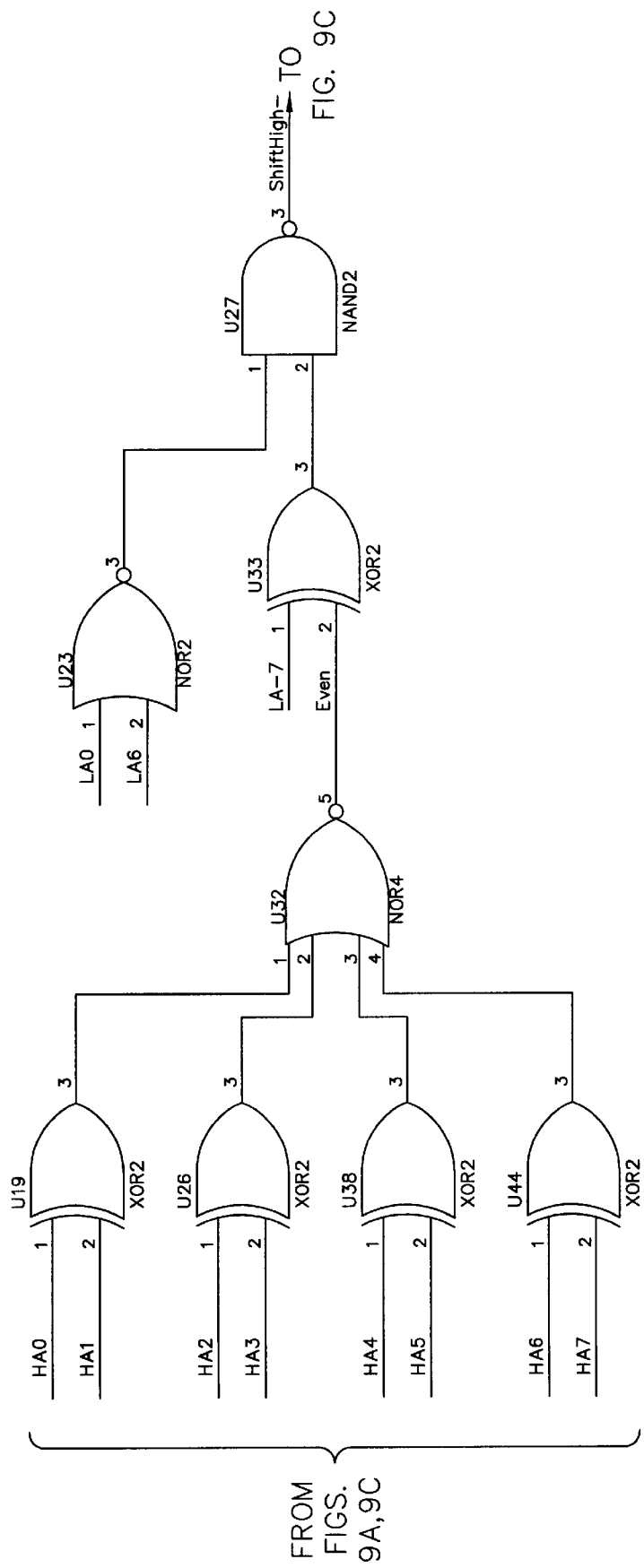
Figure 9E:
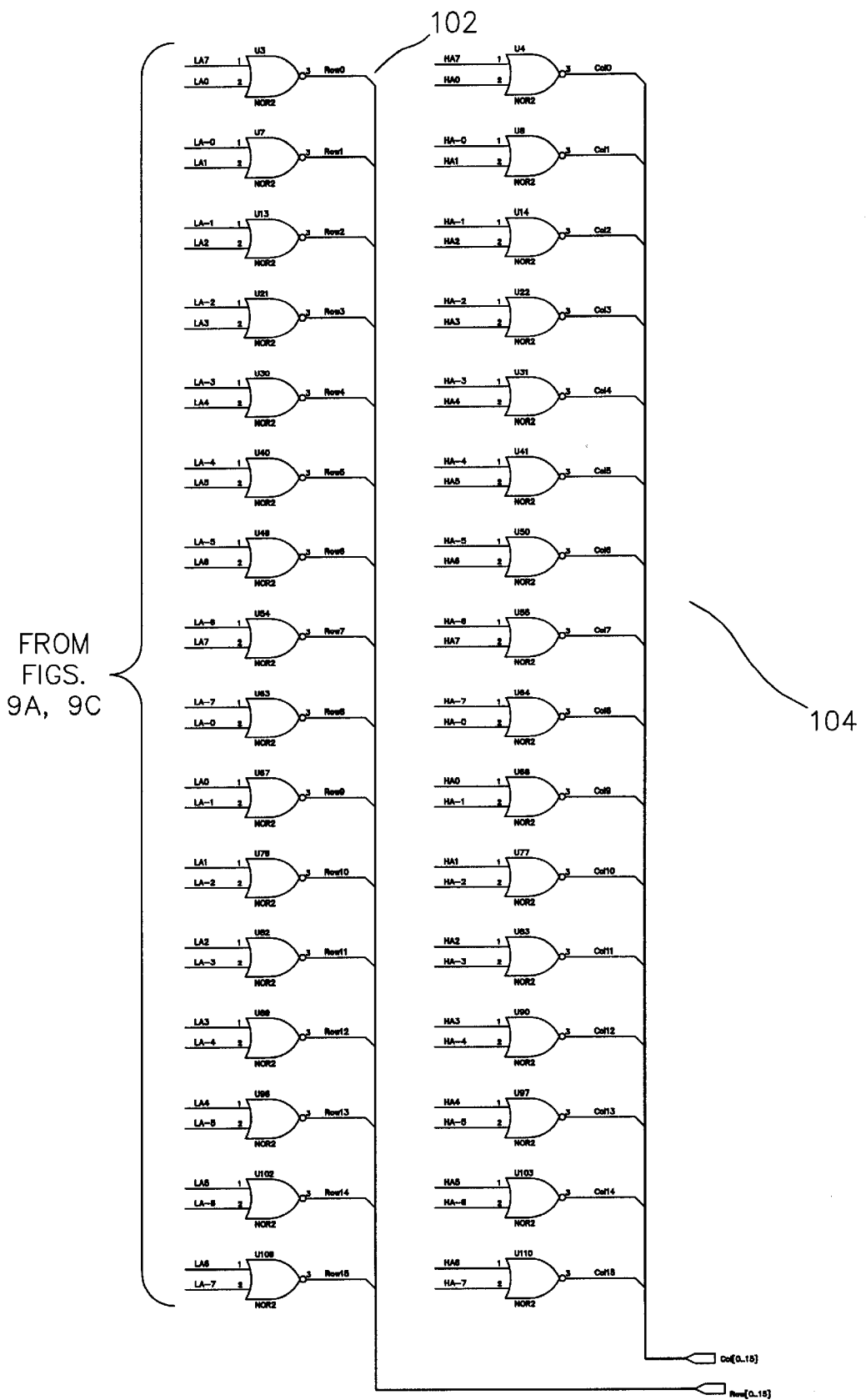
Figure 9F:
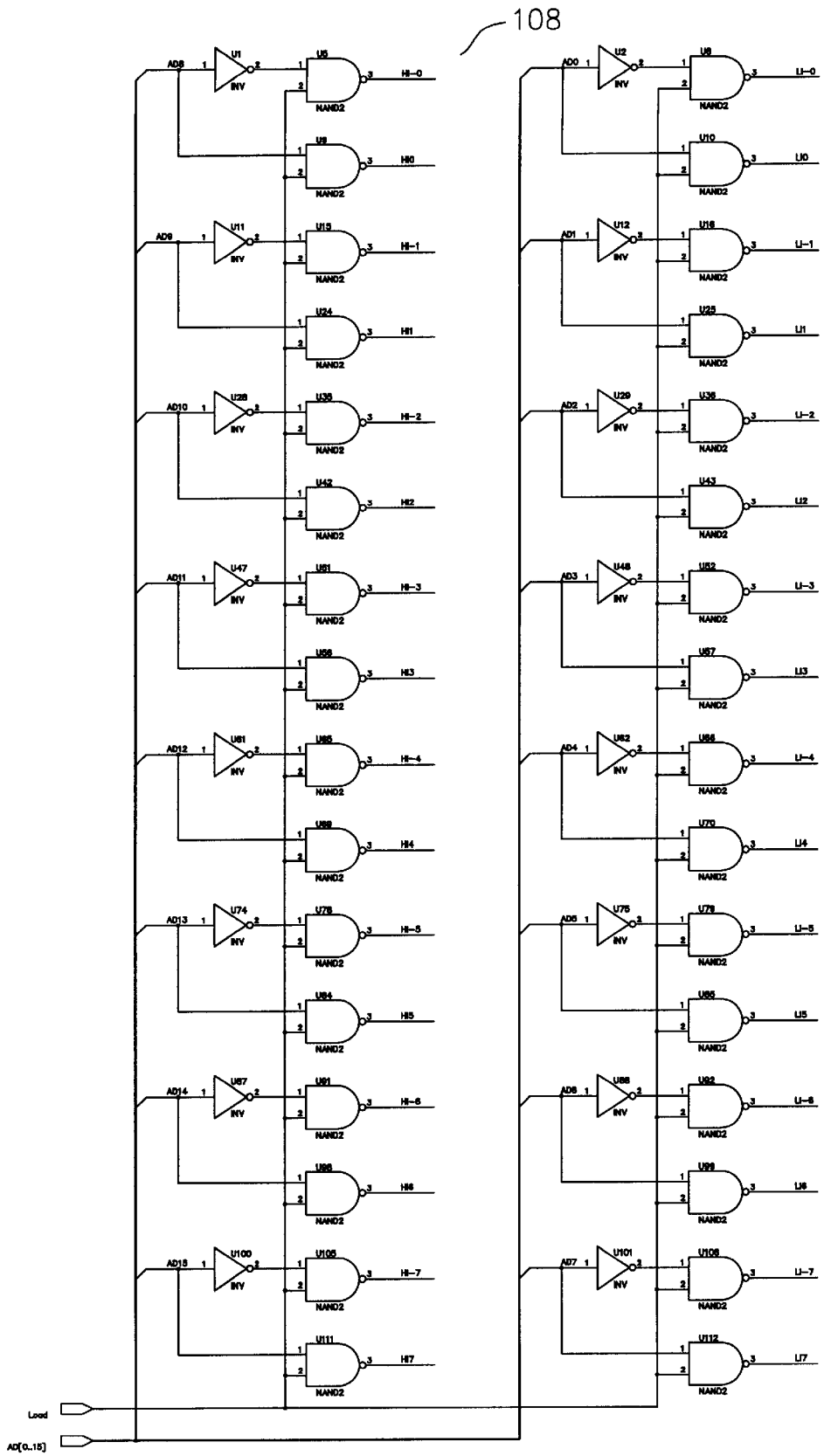

To accomplish the aforementioned task, the address logic 92 of the present invention preferably includes row shift register 98, column shift register 100, associated decoders (102, 104), sequencing logic 106 and pre-setting logic 108. An exemplary implementation of this address logic 92 is shown in FIGS. 9A–9F. Due to the complexity of this exemplary logic implementation, there is not always a direct one-to-one correlation between these functions, i.e., there is some overlap. Basically, the flip flops of FIG. 9A correspond to the row shift register 98 and the remaining logic (including the logic for Mux2x 110 which is shown in detail in FIG. 9B) encompasses portions of the row shift register 98 and the sequencing logic 106. The flip flops of FIG. 9C correspond to column shift register 100. The remaining logic encompasses portions of the column shift register 100 and the sequencing logic 106. Additional portions of the sequencing logic 106 are shown in FIG. 9D with the clock input in FIG. 9C corresponding to write (or read) pulses. FIG. 9E shows row decoder 102 and column decoder 104. A final portion of the address logic is shown in FIG. 9F as the pre-setting logic 108.

Figure 10:
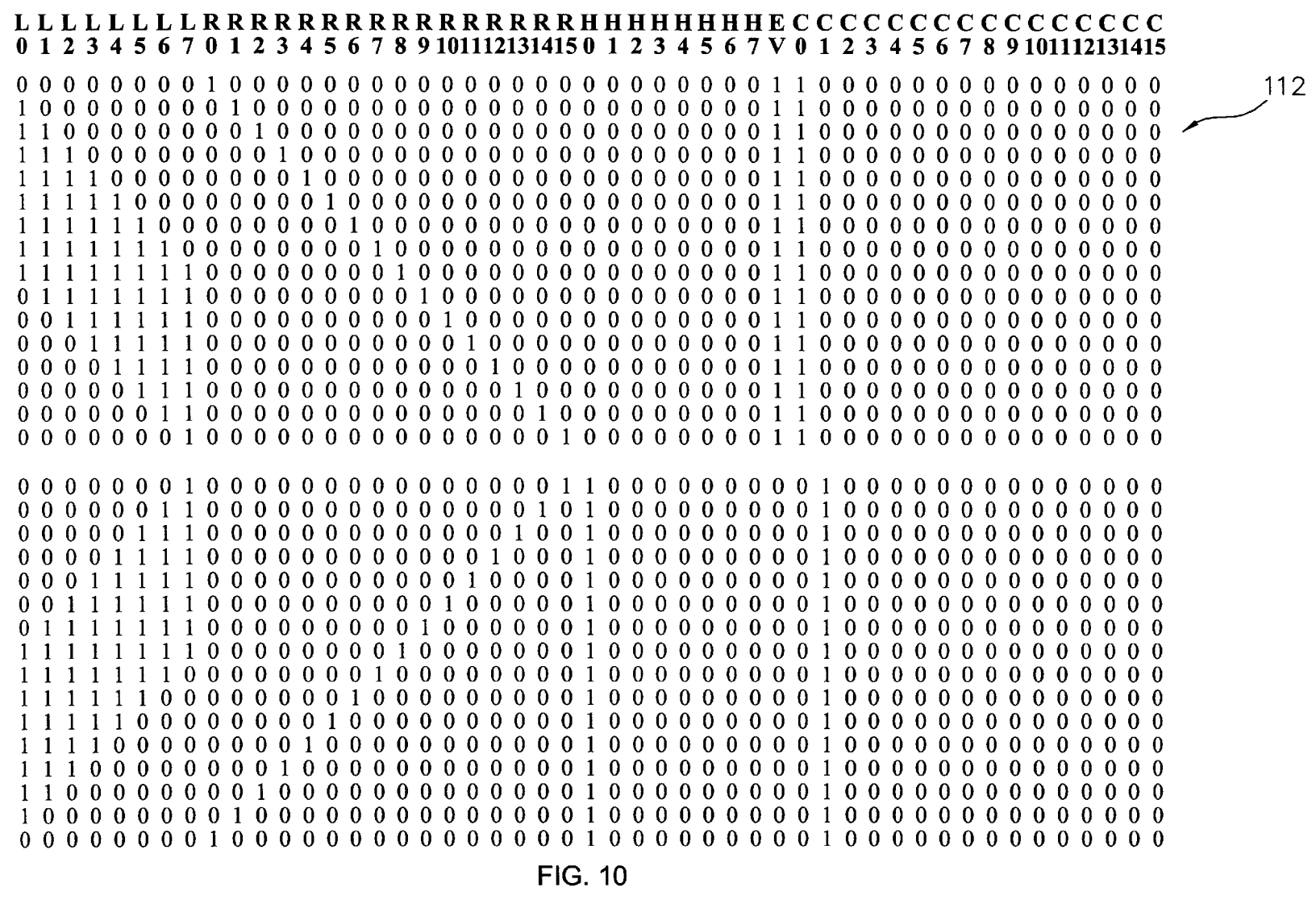

FIG. 10 shows a truth table 112 for a portion (the first two rows and columns) of the memory cell array 90 where the first 16 rows of the truth table 112 correspond to address portions shown as address path line 114 (see FIG. 8) which are followed by each clock pulse, e.g., write clock pulse. Thus, during the first 16 clock pulses, the combination of the row shift register 98, row decoder 102, and sequencing logic 106, the row count increments, i.e., from a (row, column) value of (0, 0) to (15, 0). As of the first row of the second portion of truth table 112 (i.e., row 17 of truth table 112), the row shift register 98 is stopped and the column shift register 100 shifts to the next position (15, 1), i.e., the column count increments. This transition is shown as address path line 116 in FIG. 8. Now, future clock pulses cause the row count to decrement following address path line 118 (see FIG. 8) from position (15, 1) to (0, 1). The address logic 92 follows this serpentine path until the last column is reached and the first row is reached at final address position (0, 15) 120 (see FIG. 8) where the address is "instantly" returned to the first address position (0, 0) 122 along virtual path 124. For the purposes of this patent application, all of the previously described row, column address changes are considered to be sequential, i.e., the next memory address (which is always a new memory address) selected by the sequencing logic 106 is considered to be "sequential" whether the row address increases or decreases or the column address increases or decreases. All of the described changes are still sequential in that they are the next address selected by the sequencing logic 106.

What is most significant about this exemplary embodiment is that the data bits representing addresses, see bits L0–L7 and H0–H7 in FIG. 10, are sequenced by sequencing logic 106 such that only a single bit changes at a time. Accordingly, any associated noise is minimized and predictable since one and only one bit changes with each sequential memory address.

Accordingly, what has been shown is a RAM structure that has an address structure that minimizes noise generation and a write sequencing structure that ensures that the same amount of noise is generated for each write operation, independent of the new and old values in the RAM. Thus, the noise generated is essentially data independent. Such structure is of particular value when used in the aforementioned communication structure, e.g., as an intermediate FIFO storage. While the invention has been described by means of specific embodiments and applications thereof, it is understood that numerous modifications and variations could be made thereto by those skilled in the art without departing from the spirit and scope of the invention. For example, the described techniques are equally applicable to other RAM cell structures, e.g., a one transistor static RAM cell, a dynamic RAM cell, etc. It is therefore to be understood that within the scope of the claims, the invention may be practiced otherwise than as specifically described herein.

What is claimed is:

1. A RAM data memory configured for generating predictable noise or interference related components coherent with each write cycle, essentially independent of the data content of said RAM data memory, said RAM data memory comprising:
    a plurality of memory cells, each of which being comprised of two sets of cross-coupled transistors wherein each of said cells is capable of holding a data bit having a "1" or a "0" value;
    a plurality of memory bytes wherein each of said bytes is comprised of a plurality of concurrently addressable memory cells;
    an address circuit for selectively addressing one of said memory bytes and selecting said memory byte to be read or written and thus form a portion of a read or a write cycle, respectively;
    write sequencing logic for removing charge from said selectively addressed cross-coupled transistors comprising said selectively addressed memory cells of said selectively addressed memory byte having an initial byte value before adding charge to said selectively addressed cross-coupled transistors of said selectively addressed memory cells of said selectively addressed byte to cause said memory byte to correspond to a desired byte value; and whereby
    current transitions associated with said removing and said adding of charge from said memory cells of said memory bytes are essentially independent of any relationship between said initial byte value and said desired byte value.

2. The RAM data memory of claim 1 wherein said address circuit is configured to automatically select a next memory byte following each write cycle.

3. The RAM data memory of claim 1 wherein said address circuit is comprised of a row address circuit and a column address circuit and said selected address memory byte is selected by the combination of said row and column address circuits.

4. The RAM data memory of claim 1 wherein each of said row and column address circuits is essentially comprised of a shift register configured to have a equal number of bits altered between each sequentially selected memory byte.

5. The RAM data memory of claim 1 wherein said equal number of bits altered is one.

6. The RAM data memory of claim 1 wherein said memory cells, address circuit and said write sequencing logic are all formed on a common integrated circuit.

7. The RAM data memory of claim 1 additionally comprising a plurality of address circuits, each of which is individually capable of enabling a data byte to be written to a selected portion of said RAM.

8. The RAM data memory of claim 1 wherein said RAM data memory is used in combination with communication processing circuitry for receiving and downconverting a modulated data signal, wherein the modulated data signal has a first bandwidth and said communication processing circuitry digitally samples said downconverted modulated data signal at a sample rate of at least twice the frequency of the modulated data signal and stores said sampled data into said RAM data memory and wherein essentially all noise or interference related components of said sampling and writing operations are at frequencies of at least twice the bandwidth of said downconverted modulated data signal.

9. The RAM data memory of claim 8 wherein said communication processing circuitry stores sampled data in said RAM data memory at a first time and at a second time, temporally offset from said first time, said communication circuitry retrieves said sampled data for demodulation processing.

10. A method for controlling write cycles in a RAM memory such that predictable noise or interference related components are generated coherent with each write cycle, essentially independent of the data content of said RAM data memory, wherein said RAM memory is comprised of a plurality of memory cells, each of which being suitable for containing a "1" or a "0" data bit value, a plurality of said memory cells are essentially concurrently addressable to represent a memory byte, said method comprising the steps of:
    selecting a plurality of said memory cells corresponding to a selected memory byte;
    removing power from each of said selected memory cells to cause a power reduction, wherein said power reduction is essentially independent of the data content of each of said selected memory cells;
    enabling a portion of each of said selected memory cells such that the enabled portion then represents a desired data bit value and the combination of said selected memory cells then represents a desired data byte value, wherein said step of enabling a portion of each of said selected memory cells comprises providing power to selected portions of said selected memory cells and resulting in a power increase essentially independent of the desired data byte value; and wherein
    the magnitude of said power reduction and said power increase are essentially the same.

11. The method of claim 10 wherein said RAM memory additionally includes an address circuit and said selecting step comprises selecting said plurality of memory cells according to said address circuit, wherein said method further comprises the step of automatically updating said address circuit to a new value following each memory cycle.

12. The method of claim 10 wherein said RAM data memory is used in combination with communication processing circuitry for receiving and downconverting a modulated data signal, wherein the modulated data signal has a first bandwidth and said communication processing circuitry digitally samples said downconverted modulated data signal at a sample rate of at least twice the frequency of the modulated data signal and stores said sampled data into said RAM data memory and wherein essentially all noise or interference related components of said sampling and writing operations are at frequencies of at least twice the bandwidth of said downconverted modulated data signal, said method additionally comprising the steps of:

storing sampled data in said RAM data memory at a first time; and at a second time, temporally offset from said first time, retrieving said sampled data for demodulation processing.

13. The method of claim 12 wherein a processor is used to perform said demodulation processing and said method additionally comprises the step of removing power from said processor during at least portions of said first time.

14. The method of claim 12 wherein a processor is used to perform said demodulation processing according to a clock rate and said method additionally comprising the step of reducing said clock rate of said processor during at least portions of said first time.

15. A RAM data memory configured for generating predictable noise or interference related components coherent with each write cycle, essentially independent of the data content of said RAM data memory, said RAM data memory comprising:

a plurality of memory cells, each of which being comprised of two sets of cross-coupled transistors wherein each of said cells is capable of holding a data bit having a "1" or a "0" value;

a plurality of memory bytes wherein each of said bytes is comprised of a plurality of concurrently addressable memory cells;

an address circuit for selectively addressing one of said memory bytes and selecting said memory byte to be read or written and thus form a portion of a read or a write cycle, respectively;

write sequencing logic for setting the charge level of each of said selectively addressed cross-coupled transistors of said selectively addressed memory byte having an initial byte value to a common voltage level before selectively altering charge to said selectively addressed cross-coupled transistors of said selectively addressed memory cells of said selectively addressed byte to cause said memory byte to correspond to a desired byte value; and whereby current transitions associated with said removing and said adding of charge from said memory cells of said memory bytes are essentially independent of any relationship between said initial byte value and said desired byte value.

16. The RAM data memory of claim 15 wherein said address circuit is configured to automatically select a next memory byte following each write cycle.

17. The RAM data memory of claim 15 wherein said address circuit is comprised of a row address circuit and a column address circuit and said selected address memory byte is selected by the combination of said row and column address circuits.

18. The RAM data memory of claim 15 wherein each of said row and column address circuits is essentially comprised of a shift register configured to have a equal number of bits altered between each sequentially selected memory byte.

19. The RAM data memory of claim 18 wherein said equal number of bits altered is one.

20. The RAM data memory of claim 15 wherein said memory cells, address circuit and said write sequencing logic are all formed on a common integrated circuit.

21. The RAM data memory of claim 15 wherein said common voltage level is a low voltage level.

22. The RAM data memory of claim 15 wherein said common voltage level is a high voltage level.

23. The RAM data memory of claim 15 wherein said common voltage level is a voltage level approximately half way between a low and a high voltage level.

24. The RAM data memory of claim 15 additionally comprising a plurality of address circuits, each of which is individually capable of enabling a data byte to be written to a selected portion of said RAM.

25. The RAM data memory of claim 15 wherein said RAM data memory is used in combination with communication processing circuitry for receiving and downconverting a modulated data signal, wherein the modulated data signal has a first bandwidth and said communication processing circuitry digitally samples said downconverted modulated data signal at a sample rate of at least twice the frequency of the modulated data signal and stores said sampled data into said RAM data memory and wherein essentially all noise or interference related components of said sampling and writing operations are at frequencies of at least twice the bandwidth of said downconverted modulated data signal.

26. The RAM data memory of claim 25 wherein said communication processing circuitry stores sampled data in said RAM data memory at a first time and at a second time, temporally offset from said first time, said communication circuitry retrieves said sampled data for demodulation processing.

27. A method for controlling write cycles in a RAM memory such that predictable noise or interference related components are generated coherent with each write cycle, essentially independent of the data content of said RAM data memory, wherein said RAM memory is comprised of a plurality of memory cells comprised of two cross-linked sets of transistors, each of which memory cells being suitable for containing a "1" or a "0" data bit value, a plurality of said memory cells are essentially concurrently addressable to represent a memory byte, said method comprising the steps of:

selecting a plurality of said memory cells corresponding to a selected memory byte;

adjusting the charge level of each set of transistors for each of said selected memory cells to a common voltage level resulting in a first charge level adjustment, wherein the magnitude of said first charge level adjustment is essentially independent of the data content of each of said selected memory cells; and enabling a set of transistors for each of said selected memory cells such that the enabled set of transistors then represents a desired data bit value and the combination of said selected memory cells then represents a desired data byte value, wherein said step of enabling a set of transistors of each of said selected memory cells results in a second charge level adjustment essentially independent of the desired data byte value.

28. The method of claim 27 wherein the desired data byte value is provided to said selected memory cells via a data bus comprised of a plurality of pairs of differential data lines and wherein said method additionally comprises the sequential steps of:

(1) adjusting the charge level of each of said differential data lines to a common voltage level; and (2) differentially setting each pair of differential data lines to differential values corresponding to the desired data byte value, whereby noise components corresponding to the data bus are essentially data independent.

29. The method of claim 27 wherein said RAM memory additionally includes an address circuit and said selecting step comprises selecting said plurality of memory cells according to said address circuit, wherein said method further comprises the step of automatically updating said address circuit to a new value following each memory cycle.

30. The method of claim 27 wherein said adjusting the charge level step comprises adjusting outputs of each of said selected sets of transistors to a common low voltage level.

31. The method of claim 27 wherein said adjusting the charge level step comprises adjusting outputs of each of said selected sets of transistors to a common high voltage level.

32. The method of claim 27 wherein said adjusting the charge level step comprises adjusting outputs of each of said selected sets of transistors to a common voltage level between a low voltage level and a high voltage level.

33. The method of claim 27 wherein said RAM data memory is used in combination with communication processing circuitry for receiving and downconverting a modulated data signal, wherein the modulated data signal has a first bandwidth and said communication processing circuitry digitally samples said downconverted modulated data signal at a sample rate of at least twice the frequency of the modulated data signal and stores said sampled data into said RAM data memory and wherein essentially all noise or interference related components of said sampling and writing operations are at frequencies of at least twice the bandwidth of said downconverted modulated data signal, said method additionally comprising the steps of:

storing sampled data in said RAM data memory at a first time; and at a second time, temporally offset from said first time, retrieving said sampled data for demodulation processing.

34. A communication processor suitable for retrieving digital data modulated within an analog signal, wherein said communication processor is suitable for use within an implantable device, said communication processor comprising:

a digital sampler for sampling the analog signal and periodically converting samples of the analog signal into bytes of digital data during a first time period;

a RAM for storing said sampled bytes of digital data; and a processor for retrieving said sampled bytes of digital data from said RAM and processing said retrieved samples during a second time period, wherein said second time period is temporally offset from said first time period.

35. The communication system of claims 34 wherein said RAM data memory is configured for generating predictable noise or interference related components coherent with each write cycle, essentially independent of the data content of said RAM data memory, wherein said RAM data memory comprises:

a plurality of memory cells, each of which being comprised of two sets of cross-coupled transistors wherein each of said cells is capable of holding a data bit having a "1" or a "0" value;

a plurality of memory bytes wherein each of said bytes is comprised of a plurality of concurrently addressable memory cells;

an address circuit for selectively addressing one of said memory bytes and selecting said memory byte to be read or written and thus form a portion of a read or a write cycle, respectively;

write sequencing logic for setting the charge level of each of said selectively addressed cross-coupled transistors of said selectively addressed memory byte having an initial byte value to a common voltage level before selectively altering charge to said selectively addressed cross-coupled transistors of said selectively addressed memory cells of said selectively addressed byte to cause said memory byte to correspond to a desired byte value; and whereby current transitions associated with said removing and said adding of charge from said memory cells of said memory bytes are essentially independent of any relationship between said initial byte value and said desired byte value.

36. The communication system of claim 35 wherein said address circuit is configured to automatically select a next memory byte following each write cycle.

37. The communication system of claim 35 wherein said address circuit is comprised of a row address circuit and a column address circuit and said selected address memory byte is selected by the combination of said row and column address circuits.

38. The communication system of claim 35 wherein each of said row and column address circuits is essentially comprised of a shift register configured to have a equal number of bits altered between each sequentially selected memory byte.

39. The RAM data memory of claim 38 wherein said equal number of bits altered is one.

40. The communication system of claim 35 wherein said memory cells, address circuit and said write sequencing logic are all formed on a common integrated circuit.

41. The communication system of claim 35 wherein said common voltage level is a low voltage level.

42. The communication system of claim 35 wherein said common voltage level is a high voltage level.

43. The communication system of claim 35 wherein said common voltage level is a voltage level approximately half way between a low and a high voltage level.

44. The communication system of claim 35 additionally comprising a plurality of address circuits, each of which is individually capable of enabling a data byte to be written to a selected portion of said RAM.

45. The communication system of claim 35 wherein said implantable device is encased in an essentially cylindrical housing having an axial dimension of less than 60 mm and a lateral dimension of less than 6 mm.

46. The communication system of claim 45 wherein said implantable device includes a rechargeable battery contained within said housing.

47. A method for controlling write cycles in a RAM memory such that predictable noise or interference related components are generated coherent with each write cycle, essentially independent of the data content of said RAM memory, wherein said RAM memory is comprised of a plurality of memory cells, each of which memory cells being suitable for containing a "1" or a "0" data bit value, a plurality of said memory cells are essentially concurrently addressable to represent a memory byte and are provided a desired byte value via a common differential data bus, said method comprising the steps of:

selecting a plurality of said memory cells corresponding to a selected memory byte;

adjusting the charge level of each of said differential data lines to a common voltage level; and differentially setting each pair of differential data lines to differential values corresponding to the desired data byte value and providing said desired data value to said selected plurality of said memory cells, whereby noise components corresponding to the data bus are essentially data independent.

48. The method of claim 47 wherein said adjusting the charge level step comprises adjusting said differential data lines to a common low voltage level.

49. The method of claim 47 wherein said adjusting the charge level step comprises adjusting said differential data lines to a common high voltage level.

50. The method of claim 47 wherein said adjusting the charge level step comprises adjusting said differential data lines to a common voltage level between a low voltage level and a high voltage level.

* * * * *